BONDING TELLURIDE-CONTAINING THERMOELECTRIC MODULES

Filed Nov. 20, 1963

INVENTOR
WILLIAM THOMAS HICKS

BY James J. Flynn
ATTORNEY 3,298,095

BONDING TELLURIDE-CONTAINING THERMO-ELECTRIC MODULES

William Thomas Hicks, Windsor Hills, Wilmington, Del., assignor to E. I. du Pont de Nemours and Company, Wilmington, Del., a corporation of Delaware Filed Nov. 20, 1963, Ser. No. 325,037
12 Claims. (Cl. 29—472.7)

This invention relates to a process for the preparation of a bonded, segmented portion of a thermoelectric module. More specifically, the invention relates to a process for bonding together thermoelectric materials, at least one of which is a telluride, to form segmented thermoelectric modules comprising at least two thermoelectric materials in at least one leg of the thermoelectric device.

Recently the generation of electrical energy from heat sources has become a subject of major interest. Many thermoelectric materials have been suggested as of value in transforming heat from, for example, a nuclear pile, a gas flame or from radiant sources, directly to electricity. In general, the modules are constructed to make use of the thermoelectric properties of these materials consist of a metal connecting piece (a hot-junction) joining two thermoelectric legs, one leg a p-type, the other an n-type. The thermoelectric legs are joined to a common conductor at the heated end and to separate conductors at the cold end in such a way that electric current generated by the flow of heat through the paired elements may be drawn off for useful work.

Among the thermoelectric materials which have been found to be most useful as p-type components in these devices is lead telluride. Frequently minute quantities of other elements are added to lead telluride for the purpose of further improving its electrical properties. The addition of other elements to a thermoelectric or semi-conductor material such as lead telluride is a well known practice which is generally termed "doping." Although lead telluride is a very vaulable thermoelectric material in the temperature range of from room temperature, e.g., about 25° C. to about 500° C., its usefulness as a thermoelectric material is severely limited by these temperatures. Lead telluride at about 600° C. becomes a very inefficient thermoelectric material, and at temperatures of about 900° C. it melts and, therefore, becomes completely useless in thermoelectric devices. However, other thermoelectric materials are known which can be used at higher temperatures than are suitable for lead telluride, but in many cases these materials do not possess, in the lower temperature range, the degree of efficiency lead telluride does. Therefore, it is common practice to prepare thermoelectric modules in which two or more thermoelectric materials of the same type, p or n, are used in combination, so that an efficient transformation of heat to electricity may be effected over a wide temperature range. When two or more thermoelectric materials are used in combination to form a segmented leg of a thermoelectric module, certain requirements must be met in order to produce a satisfactory product. It is necessary that the segments of the leg be bonded in such a manner that there is good electrical conductivity through the bond, and the bond must show good mechanical strength. Both of these properties must be maintained, not only while the device is at room temperature, but also at much higher temperatures for long periods of time without diffusion of the elements composing the segments so as to degrade the thermoelectric properties of the segments.

An object of this invention, therefore, is to provide a process for bonding thermoelectric materials to each other, at least one of which contains a telluride, to produce a segmented portion of a thermoelectric module wherein the bond formed has good mechanical strength and good electrical conductivity. Another object of this invention is to provide a process for bonding thermoelectric materials to each other, at least one of which contains a telluride and effecting a bond between the segments of the leg that can withstand long exposure to high temperatures without degradation in mechanical or electrical properties, and without diffusion of any of the seperate elements composing the segments in such a way as to degrade the thermoelectric properties of the seperate segments. Another object of this invention is to provide a process for bonding theremoelectric materials, at least one of which must contain a telluride, in a segmented portion of a module without recourse to elaborate surface conditioning steps. These and other objects and advantages of the invention will become more apparent upon reference to the following specification and claims and appended drawings.

Figure 1:
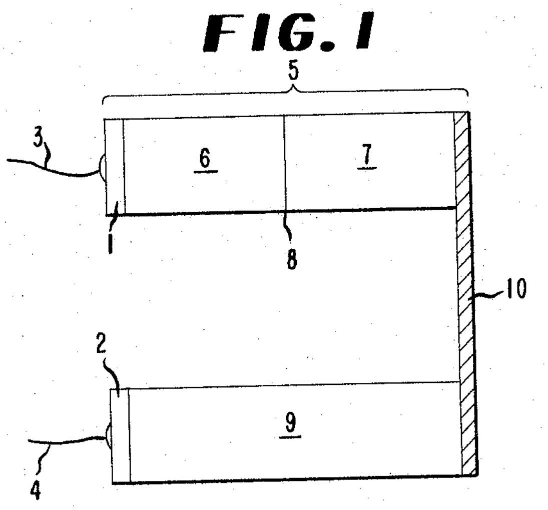
FIGURE 1 illustrates a vertical sectional view of a theremoelectrical module.

It has been found that a bond may be formed between thermoelectrical materials, at least one of which contains a telluride, which constitute at least one leg of a thermoelectrical module as shown, for example, in element 5 of FIGURE 1, provided that the bonding process is conducted in an enviroment containing a certain amount of oxygen. In accordance with the present invention a bond having the necessary mechanical strength and which will exhibit electrical properties may be formed by pressing the segments of the thermoelectric materails together and heating the pressed unit at an elevated temperature in an enviroment comprising oxygen. It has been discovered that, within certain limits, the amount of oxygen present in the heat-treating environment is critical; too little oxygen results in a mechanically weak bond; too much oxygen degrades the thermoelectric properties of the component parts of the segment by reacting with them at the bonding temperatures. The amount of oxygen used in the bonding environment of the process must be from 0.08 to 0.10 atmosphere of oxygen and the temperature at which bonding is conducted is between about 400° to 700° C. Air may, of course, be used as the gas comprising oxygen provided the conditions of operation are such that the requisite amount of oxygen is present.

An alternative and preferred embodiment of the invention involves carrying out the bonding process in the presence of an inert gas. The gas utilized may be any gas inert to the materials to be bonded, at the bonding temperature, for example, argon, neon or nitrogen.

The instant invention may be conducted under gaseous pressures greater or less than atmospheric pressure provided, of course, that the amount of oxygen used in the bonding environment is from 0.08 to 0.10 atmosphere. It is convenient and entirely satisfactory to operate the process under conditions wherein the total gas pressure of oxygen and an inert gas in the bonding environment is not greater than about 1 atmosphere. However, it should be understood that superatmospheric pressures may be employed in the process, if desired.

In order to more fully describe a preferred embodiment of the invention, reference is made to FIGURE 1 which illustrates a vertical sectional view of a thermoelectric module that is used for the production of electrical power directly from heat sources. Cold junctions indicated at 1 and 2 have connected thereto conducting lead wires 3 and 4. Element 5 indicates a p-type leg of the module, which is segmented, and comprises at least two segments which are preferably of thermoelectric materials which function at their optimum efficiency in different but preferably, overlapping temperature ranges.

The preferred materials for the preparation of thermoelectric modules according to the hereindescribed process are lead telluride, indicated at segment 6 in the drawing and tungsten diselenide, indicated at segment 7. The bond 8 between these segments holds said segments firmly together and does not adversely effect the electrical conductivity of the leg. The second leg of the module, the n-type leg, is indicated at 9 and it may be composed of a single thermoelectric material, for example, constantan metal or germanium-silicon alloy. However, if desired, this leg of the module may also be of segmented construction. The two legs of the device are joined at the high temperature junction 10 by a metal strap which may be composed of a refractory metal or alloy. The lead telluride and tungsten diselenide are bonded together by positioning them end to end and applying a pressure of between about 100 to 200 p.s.i to press the segments together. The segments are heated, while held under this mechanical pressure, to a temperature of from about 400° to 700° C. for a period of about 15 to 60 minutes in an environment containing oxygen at a gas pressure of 0.08 to 0.10 atmosphere. There may be present an amount of inert gas sufficient to bring the total gas pressure to 1 atmosphere. The newly formed segmented leg portion was tested in a thermoelectric module for electrical conductivity through the bond and for bond strength. The results are set forth fully hereinbelow.

The following examples will illustrate in detail the process which has been found to be effective in producing a satisfactory bond.

*Example 1*

A piece of lead telluride (doped with sodium) was cut from a cast ingot and machined to form a right circular cylinder 0.5″ diameter by 0.5″ length. In a similar manner, a right cylinder of the same dimensions was prepared from a pressed powder compact of tantalum-doped tungsten diselenide. These pieces were placed end to end and a pressure of about 150 p.s.i was applied longitudinally. The pieces, still held under this pressure, were heated to a temperature of about 500° C. in an environment containing oxygen at a partial pressure of 0.08 atmosphere, and having the inert gas, argon, present in an amount sufficient to bring the total gas pressure to 1 atmosphere, i.e., 8 volumes of oxygen and 92 volumes of argon, and held under these conditions for 30 minutes. Subsequent to this heating, the pressure was released and the unit was annealed for 15 hours at a temperature of 500° C. in at atmosphere of argon at 2 cm. Hg. pressure.

The electrical resistance of the bond thus formed was determined by measuring the resistance between a stationary electrode fastened to a point on one segment of the segmented leg and a probe which was moved along the length of the leg through the bond. Electric resistance corrected to 1 sq. cm. cross-section area was plotted as a function of distance. The resulting curve was two straight lines of different slope intersecting at the location of the bond with no discontinuity. This indicates a contact resistance less than 0.1 milli-ohm cm. for 1 sq. cm. cross-section.

Figure 2:
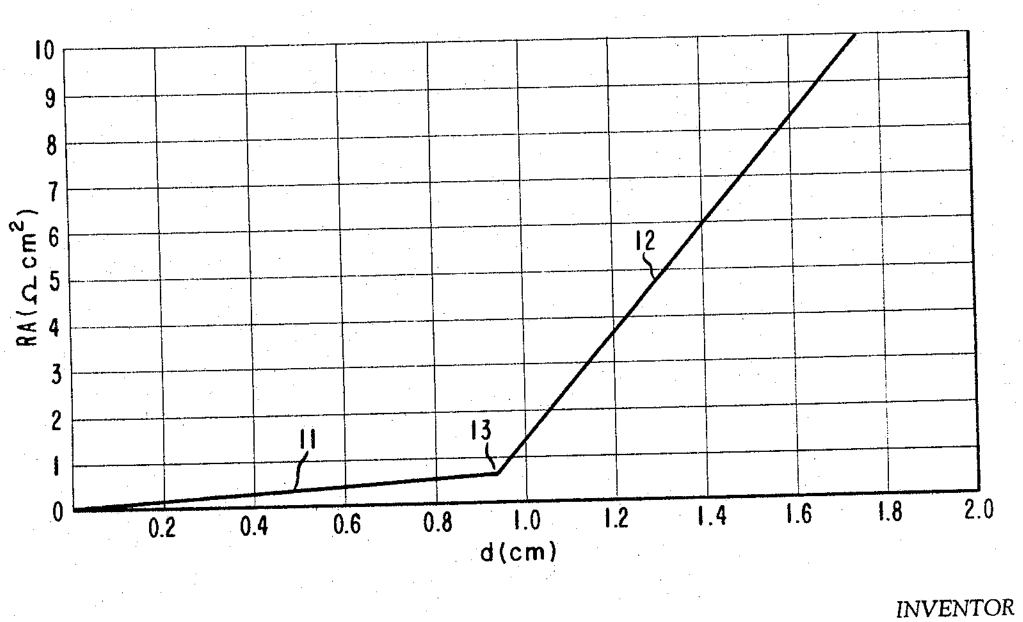
FIGURE 2 shows the results of a traverse across the bond, formed according to the process of this invention, to measure electrical resistivity.

There is shown in FIGURE 2 the results of a traverse across a bond formed according to the process of this invention to measure electrical resistivity. In this case, a segmented leg for a thermoelectric module was prepared exactly according to the procedure of Example 1, except that a much more severe heat treatment was applied before testing for electrical properties and chemical composition. In this case, the bonded unit was heated for 10 days at 500° C. before being tested as follows:

The electrical resistance of this bond was determined by measuring the resistance between a stationary electrode fastened to a point on one segment of the segmented element and a probe which was moved along the length of the leg across the bond to the second segment of the bonded unit. In FIGURE 2 electrical resistance, R(Ω), corrected to 1 sq. cm. coross-sectional area is plotted against distance, *d*(cm.). The slopes of the two straight line portions of the curve, indicated as 11 and 12 give the resistivities of the respective segments of the bonded unit. The inflection point of the curve at 13 corresponds to the location of the bond. Since there is no discontinuity between the two segments of the curve, the bond is shown to have negligible contact resistance amounting to less than 0.1 milli-ohm for a 1 sq. cm. cross-sectional area.

The electrical resistivities measured on the separate segments of this bonded unit show no degradation from the values obtained on the starting materials. The fact that the portions of the curve indicated as 11 and 12 are straight, up to the point of the bond, indicates that there was no diffusion with changes in electrical resistivity, even with the long annealing time at high temperature.

In order to determine within the bond and in the adjacent areas of the bonded unit, the distribution of the elements which comprise the component thermoelectric portions of the unit, an electron microprobe analysis was made for the elements lead, tellurium, tungsten, tantalum and selenium.

This analysis showed that no diffusion whatsoever, even on a micron scale, had taken place because of the formation of the bond. From the results obtained, it can be concluded that no degradation or poisoning due to the diffusion of the component elements has taken place in the thermoelectric materials during the long annealing time.

The bond on this segmented unit was sufficiently strong to withstand the considerable handling of the piece necessary to fabricate a thermoelectric module comprising the unit, as well as the thermal cycling of the finished module when in operation.

*Example 2*

The above bonding procedure was repeated exactly as described in Example 1 above, using portions of the same thermoelectric materials with the exception that the environment in which bonding, or pressing together of the segments, was performed comprised pure argon rather than the oxygen-argon mixture of Example 1. The heating time and temperature for the attempted formation of a bond was again 30 minutes at 500° C. Under these conditions no bonding at all was effected betwen the two thermoelectric materials.

Although the invention has been described in relation to bonding a thermoelectric material containing telluride to tungsten diselenide, other thermoelectric materials may be bonded to telluride-containing materials such as, for example, cerium sulfide, manganese silicide or germanium-silicon alloy. Also, salts of tellurium other than lead telluride can be used, for example, bismuth telluride or germanium telluride. It is preferred to use so-called "doped" thermoelectric materials in the modules prepared by the process of this invention because the thermoelectric properties of the materials are thereby improved.

The gaseous environment under which bonding is conducted must contain from about 0.08 to 0.10 atmosphere of oxygen. As pointed out above, if lesser amounts of oxygen are used, a weak and unsatisfactory bond is formed; while on the other hand, if greater amounts of oxygen are used, degradation of thermoelectric properties of the segmented leg results. Optitmum results are produced when oxygen is mixed with a gas that is inert to the materials being bonded, at the bonding temperature, such as argon, nitrogen, helium, neon and the like. Furthermore, the process may be carried out under pressure if desired; however, this is not usually convenient nor is it necessary. Indeed, the preferred total gas pressure for efficient operation of the process should not be greater than about 1 atmosphere.

The temperature at which the thermoelectric materials are heated during the bonding process is between about 400° C. to 700° C., while optimum results are obtained when the temperature is maintained at about 500° C. The time required for bonding together the thermoelectric materials may vary. Usually the reaction is completed in about thirty minutes, although in some instances a satisfactory bond is produced in less time. Heating for a time longer than thirty minutes shows no deleterious effects on the properties of the materials, but generally this is not necessary.

In forming a bond between the different thermoelectric materials, mechanical pressures of the order of about 100 to 200 pounds per square inch applied to the segments are satisfactory. However, the particular range is not critical and pressures of up to the breaking point of the materials are satisfactory.

By practicing the process described herein thermoelectric materials, at least one of which contains tellurium, can be used in series by bonding them together in such a manner that there is no substantial loss of electrical conductivity across the bond and the strength of the bond is excellent. Thus, the efficiency of the thermoelectric module is increased because each thermoelectric materal can opertae at its own best temperature without loss in thermoelectric properties.

What is claimed is:

1. A process for bonding together thermoelectric materials wherein one of said materials is a telluride, which comprises pressing the thermoelectric materials together, and while maintaining mechanical pressure thereon, heating said materials to a temperature of from about 400° to about 700° C. in an environment which is inert except for the presence of 0.08 to 0.1 atmosphere of oxygen.

2. A process for bonding together thermoelectric materials which comprises pressing together lead telluride and tungsten diselenide, and while maintaining mechanical pressure thereon, heating said materials to a temperature of from about 400° to 700° C. in an environment which is inert except for the presence of 0.08 to 0.1 atmosphere of oxygen.

3. A process for bonding together thermoelectric materials wherein one of said materials is a telluride, which comprises pressing the thermoelectric materials together and while maintaining mechanical pressure thereon, heating said materials to a temperature of from about 400° to about 700° C. in an environment containing 0.08 to 0.1 atmosphere of oxygen and in the presence of an inert gas.

4. The process according to claim 3 wherein the amount of inert gas added is sufficient to bring the total gas pressure to about 1 atmosphere.

5. A process for bonding together thermoelectric materials which comprises pressing together lead telluride and tungsten diselenide, and while maintaining mechanical pressure thereon, heating said materials to a temperature of from about 400° to 700° C. in an environment containing 0.08 to 0.1 atmosphere of oxygen and in the presence of an inert gas.

6. The process according to claim 5 wherein the environment contains 0.08 atmosphere of oxygen.

7. The process according to claim 5 wherein the inert gas is argon.

8. The process according to claim 5 wherein the amount of inert gas added is sufficient to bring the total gas pressure to about 1 atmosphere.

9. A process for bonding together thermoelectric materials which comprises pressing together lead telluride and tungsten diselenide at pressures of from about 100 to 200 pounds per square inch, and while maintaining this pressure, heating said materials to a temperature of from about 400° to about 700° C. in an environment contianing 0.08 to 0.1 atmosphere of oxygen and having an amount of inert gas sufficient to bring the total gas pressure to about 1 atmosphere.

10. The process according to claim 9 wherein the inert gas is nitrogen.

11. A process for bonding together thermoelectric materials which comprises pressing together sodium-doped lead telluride and tantalum-doped tungsten diselenide at a pressure of about 150 pounds per square inch, and while maintaining this pressure, heating said materials to a temperature of about 500° C. for about 30 minutes in an environment containing 0.08 atmosphere of oxygen and having an amount of inert gas sufficient to bring the total gas pressure to 1 atmosphere.

12. The process according to claim 11 wherein the inert gas is argon.

References Cited by the Examiner

UNITED STATES PATENTS 3,031,516 4/1962 Pessel.
3,235,957 2/1966 Horsting ---------- 29—494 X JOHN F. CAMPBELL, *Primary Examiner.*